(12) United States Patent
Wang et al.

(10) Patent No.: US 11,876,102 B2
(45) Date of Patent: Jan. 16, 2024

(54) DISPLAY SUBSTRATE, DISPLAY PANEL AND DISPLAY APPARATUS

(71) Applicants: Beijing BOE Display Technology Co., Ltd., Beijing (CN); BOE TECHNOLOGY GROUP CO., LTD., Beijing (CN)

(72) Inventors: Xue Wang, Beijing (CN); Xiao Wang, Beijing (CN); Yan Yan, Beijing (CN); Tingting Wang, Beijing (CN); Yaya Qi, Beijing (CN); Xiaoying Li, Beijing (CN); Zhiqiang Ma, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/098,773

(22) Filed: Jan. 19, 2023

(65) Prior Publication Data
US 2023/0154935 A1 May 18, 2023

Related U.S. Application Data

(63) Continuation-in-part of application No. 17/599,024, filed as application No. PCT/CN2021/078137 on Feb. 26, 2021, now Pat. No. 11,586,088.

(30) Foreign Application Priority Data

Feb. 28, 2020 (CN) .......................... 202010130210.8

(51) Int. Cl.
G02F 1/1343 (2006.01)
G02F 1/1362 (2006.01)
H01L 27/12 (2006.01)

(52) U.S. Cl.
CPC ........ H01L 27/124 (2013.01); G02F 1/13629 (2021.01); G02F 1/134309 (2013.01);
(Continued)

(58) Field of Classification Search
CPC ............. G02F 1/1343; G02F 1/134309; G02F 1/134318; G02F 1/134363; G02F 1/1362;
(Continued)

(56) References Cited

U.S. PATENT DOCUMENTS 9,461,075 B2  10/2016  Yu et al.
10,082,715 B2  9/2018  Okada et al.
(Continued)

FOREIGN PATENT DOCUMENTS

CN  102903675 A  1/2013
CN  104090401 A  10/2014
(Continued)

OTHER PUBLICATIONS

China Patent Office, First Office Action, dated Apr. 15, 2022, for corresponding Chinese application 202010130210.8, see parent application.
(Continued)

Primary Examiner — Thoi V Duong
(74) Attorney, Agent, or Firm — HOUTTEMAN LAW LLC

(57) ABSTRACT

The present disclosure provides a display substrate, a display panel and a display apparatus, belonging to the field of display technology. The display substrate includes a base, a plurality of common electrodes and a plurality of common electrode lines, the common electrodes are distributed on the base in an array, the common electrode lines extend along a row direction, and each common electrode line is connected to a corresponding row of common electrodes. The common electrode line is connected to the common electrode through
(Continued)

a conductive connection portion, and the conductive connection portion includes conductive structures stacked on top of one another in a plurality of layers. The display substrate can reduce the resistance between the common electrode and the common electrode line, thereby reducing the voltage difference between the common electrodes in the display substrate and improving the uniformity of the common voltage therein.

20 Claims, 15 Drawing Sheets

(52) U.S. Cl.
CPC .. *G02F 1/134318* (2021.01); *G02F 1/136286* (2013.01); *H01L 27/1248* (2013.01)

(58) Field of Classification Search
CPC ......... G02F 1/136227; G02F 1/136286; G02F 1/13629; G02F 1/1368; H01L 27/124; H01L 27/1248
See application file for complete search history.

(56) References Cited

U.S. PATENT DOCUMENTS

| | | | |
|---|---|---|---|
| 10,146,096 B2 | 12/2018 | Tomioka et al. | |
| 10,488,710 B2 | 11/2019 | Guo et al. | |
| 10,942,407 B2 * | 3/2021 | Mori | G02F 1/136286 |
| 2007/0002246 A1 | 1/2007 | Chang et al. | |
| 2015/0160521 A1 | 6/2015 | Tomioka et al. | |
| 2015/0355516 A1 | 12/2015 | Imai et al. | |
| 2016/0252793 A1 | 9/2016 | Cheng et al. | |
| 2016/0377945 A1 | 12/2016 | Cai | |
| 2017/0271370 A1 | 9/2017 | Wang et al. | |
| 2017/0307921 A1 | 10/2017 | Feng | |
| 2018/0088373 A1 | 3/2018 | Guo et al. | |

FOREIGN PATENT DOCUMENTS

| | | |
|---|---|---|
| CN | 104201178 A | 12/2014 |
| CN | 104698704 A | 6/2015 |
| CN | 104885007 A | 9/2015 |
| CN | 106298811 A | 1/2017 |
| CN | 111258140 A | 6/2020 |

OTHER PUBLICATIONS

USPTO, First Office Action, dated Jun. 9, 2022, for parent U.S. Appl. No. 17/599,024, see parent application.
China Patent Office, PCT International Search Report, dated May 21, 2021, see parent application.
USPTO, Notice of Allowance, dated Oct. 19, 2022, see parent application.

* cited by examiner

DISPLAY SUBSTRATE, DISPLAY PANEL AND DISPLAY APPARATUS

CROSS-REFERENCE TO RELATED APPLICATIONS

This application is a continuation-in-part application of U.S. patent application Ser. No. 17/599,024 filed on Sep. 28, 2021, which claims the priority to the Chinese patent application No. 202010130210.8 filed on Feb. 28, 2020, the entire contents of which are incorporated herein by reference.

TECHNICAL FIELD

The present disclosure belongs to the field of display technology, and in particular, relates to a display substrate, a display panel and a display apparatus.

BACKGROUND

A display apparatus includes a common electrode circuit, and the common electrode circuit includes a base, a plurality of common electrodes, and a plurality of common electrode lines. The plurality of common electrodes are distributed on the base in an array, the plurality of common electrode lines extend along a row direction, and each common electrode line is connected to a corresponding row of the common electrodes, and the common electrode line and the common electrode are bridged by a conductive connection portion.

In a conventional common electrode circuit, Indium Tin Oxide (ITO) is typically used as a material of the conductive connection portion to connect a common electrode to a corresponding common electrode line. However, the excessively high resistivity of Indium Tin Oxide (ITO) will result in a greater loss of electric signals and therefore a larger voltage difference between the common electrodes, thereby affecting the uniformity of the display panel and reducing the quality of the displayed picture.

SUMMARY

The present disclosure provides a display substrate, a display panel and a display apparatus.

The display substrate includes: a base; a plurality of common electrodes distributed on the base in an array; and a plurality of common electrode lines extending along a row direction, each of the plurality of common electrode lines is connected to a corresponding row of the common electrodes, the common electrode line is connected to the common electrode through a conductive connection portion, and the conductive connection portion includes conductive structures stacked on top of one another in a plurality of layers.

Since in the display substrate provided in the present disclosure, the conductive connection portion, which bridges the common electrode and the common electrode line, includes the conductive structures stacked on top of one another in the plurality of layers, the resistance of the conductive connection portion can be reduced, and therefore the resistance between the common electrode and the common electrode line can be reduced, thereby reducing the voltage difference between the common electrodes in the display substrate and improving the uniformity of the common voltage therein.

In one embodiment, the display substrate further includes a plurality of pixel units, each of which includes a thin-film transistor and a pixel electrode; and the conductive structures in the plurality of layers includes a first conductive structure and a second conductive structure, the first conductive structure is disposed in a same layer as a source electrode and a drain electrode of the thin-film transistor, and is made of a same material as the source electrode and/or drain electrode; and the second conductive structure is disposed in a same layer as the pixel electrode, and is made of a same material as the pixel electrode.

In one embodiment, the display substrate further includes a plurality of gate lines and a plurality of data lines; the plurality of gate lines cross over the plurality of data lines to define the plurality of pixel units; and an interlayer insulation layer is disposed between the plurality of gate lines and the plurality of data lines, the plurality of common electrode lines and the plurality of gate lines extend along a same direction, are disposed on a same layer, and are made of a same material.

In one embodiment, in the display substrate provided in the present disclosure, a material of the second conductive structure includes Indium Tin Oxide (ITO).

In one embodiment, in the display substrate provided in the present disclosure, each of the plurality of pixel electrodes has a plurality of slits, and each of the plurality of common electrodes includes a plurality of strip-shaped sub-electrodes disposed at intervals, each of the plurality of common electrodes corresponds to a respective one of the plurality of pixel electrodes, and an orthographic projection of the strip-shaped sub-electrode of each of the plurality of common electrodes on the base overlaps with an orthographic projection of a corresponding slit of a corresponding pixel electrode on the base.

In one embodiment, in the display substrate provided in the present disclosure, an interlayer insulation layer and/or a gate insulation layer are/is included between the plurality of common electrodes and the plurality of common electrode lines, and the plurality of common electrode lines are disposed on a side of the plurality of common electrodes proximal to the base; and the conductive connection portion connects each of the plurality of common electrodes with a corresponding common electrode line of the plurality of common electrode lines through a via disposed in the interlayer insulation layer and/or gate insulation layer.

In one embodiment, the interlayer insulation layer extends between the pixel electrode and the corresponding common electrode; the conductive connection portion further includes a first connection portion that is disposed in a via in an interlayer insulation layer disposed on the common electrode and is in contact with the common electrode, and a second connection portion that is disposed in a via in an interlayer insulation layer disposed on the common electrode line and is in contact with the common electrode line; and at least one of the first connection portion and the second connection portion includes a via, which includes a first portion and a second portion, and a depth of the first portion is greater than that of the second portion.

In one embodiment, in the display substrate provided in the present disclosure, an area of an orthographic projection of the first portion on the base is one quarter of an area of an orthographic projection of the via on the base.

In one embodiment, the display substrate further includes a via in a portion of the pixel electrode overlapping with the drain electrode in a direction perpendicular to the base, the via includes a first portion and a second portion, and a depth of the first portion is greater than that of the second portion. For example, an area of an orthographic projection of the first portion on the base is one quarter of an area of an orthographic projection of the via on the base.

In one embodiment, the display substrate further includes a buffer layer which is disposed on the base, and the plurality of common electrode lines and the plurality of gate lines are disposed on the buffer layer, and the first conductive structure includes an end portion connected to and in contact with the corresponding common electrode line, the end portion including a first portion located on the buffer layer and a second portion located on the gate line and connected to the first portion.

In one embodiment, a gate line is disposed between a common electrode line and a corresponding row of common electrodes connected to the common electrode line, and the first portion is located on a side of the common electrode proximal to the gate line.

In one embodiment, the display substrate further includes a buffer layer disposed on the base, a gate electrode disposed on the buffer layer, a gate insulation layer disposed on the gate electrode, and an active layer disposed on the gate insulation layer, and the drain electrode includes a first portion disposed on the gate insulation layer and a second portion disposed on the active layer; and the pixel electrode includes a first portion covering the drain electrode and a second portion located on a surface of the gate insulation layer.

Correspondingly, the present disclosure further provides a display panel including the above-mentioned display substrate.

Correspondingly, the present disclosure further provides a display apparatus including the above-mentioned display panel.

DETAILED DESCRIPTION OF EMBODIMENTS

Figure 1:
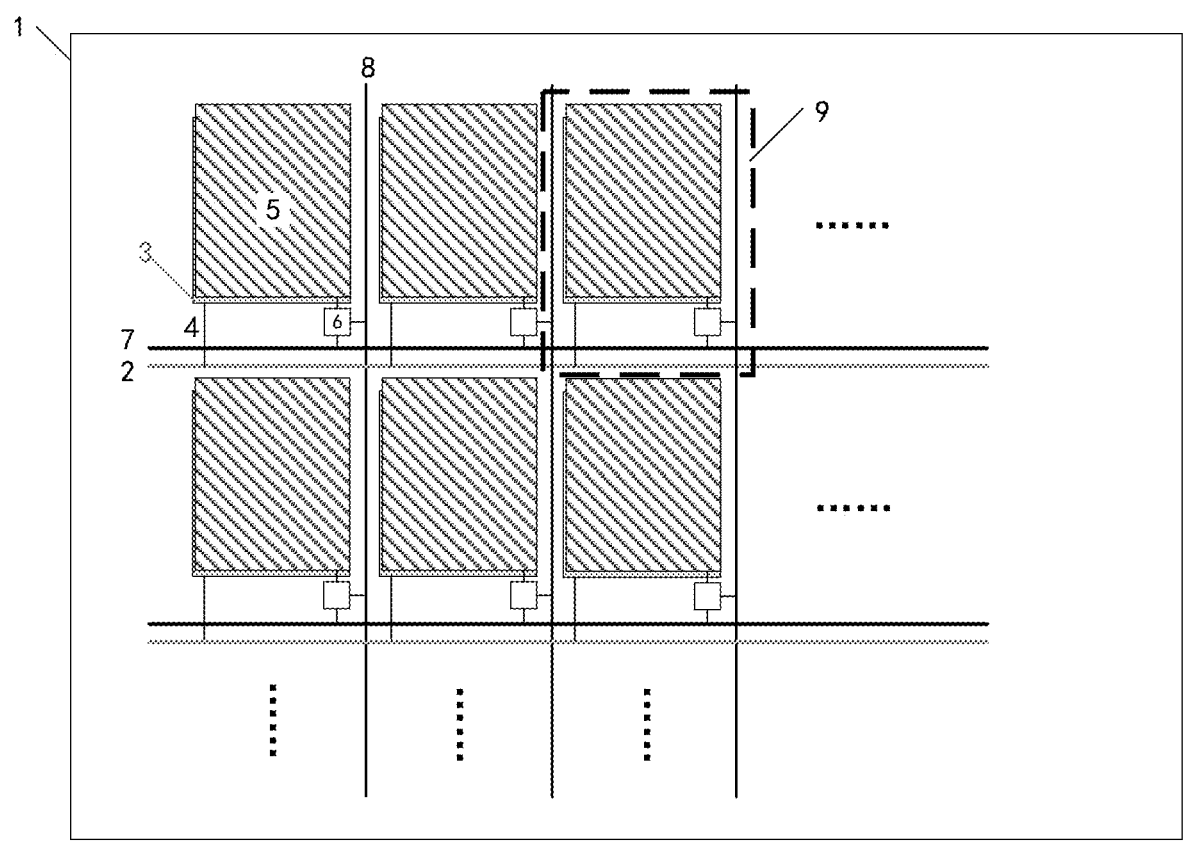
FIG. 1 is a top view of a structure of a display substrate provided in some embodiments of the present disclosure.

A further detailed description is hereinafter given to the present disclosure with reference to accompanying drawings so as to make the object, technical solutions and merits of the present disclosure more clear. Apparently, the described embodiments are only a part, but not all, of embodiments of the present disclosure. On the basis of the embodiments described in the present disclosure, other embodiments obtained by a person skilled in the art without any inventive work all fall within the protection scope of the present disclosure.

The shape and size of each member in the drawings are not intended to reflect a real scale, but, rather, are used for facilitating the understanding of the contents in the embodiments of the present disclosure.

Unless otherwise defined, technical terms or scientific terms used in the present disclosure should have the ordinary meanings that could be understood by a person skilled in the art to which the present disclosure pertains. The terms "first", "second", and the like used in the present disclosure are not intended to indicate any order, quantity, or importance, but rather are used for distinguishing one element from another. Similarly, the term "one", "an/a", "the" or the like is not intended to indicate any limitation on the quantity, but rather are used for indicating the presence of at least one entity. The term "comprising", "comprises", "including", "includes" or the like means that the element or item preceding the word comprises the element or item listed after the word and the equivalent thereof, but do not exclude the presence of other elements or items. The term "connected", "coupled" or the like is not restricted to a physical or mechanical connection, but may include an electrical connection, whether direct or indirect. The terms "upper", "lower", "left", "right" and the like are used merely to indicate relative positional relationships, and when the absolute position of the object being described is changed, these relative positional relationships may also be changed accordingly.

Figure 2:
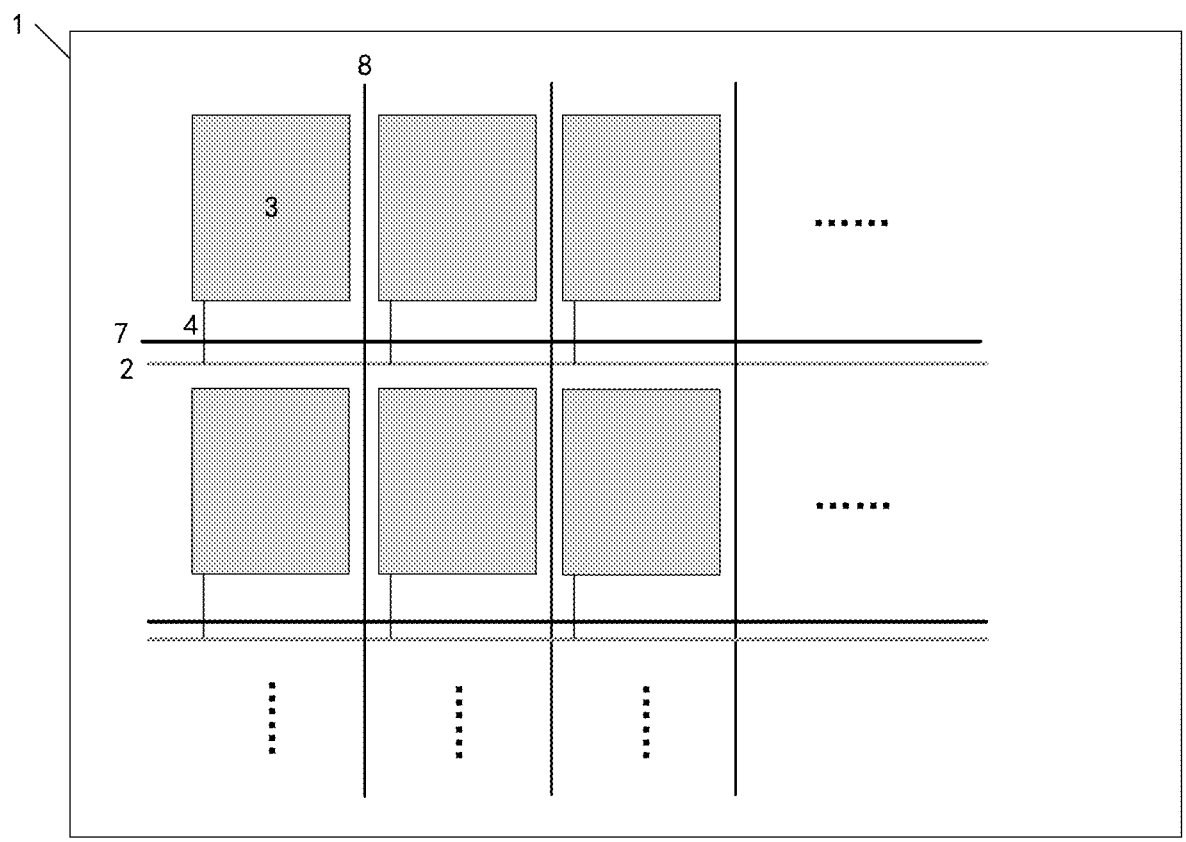
FIG. 2 is a top view of a structure of common electrodes and common electrode lines in a display substrate provided in some embodiments of the present disclosure.
Figure 3:
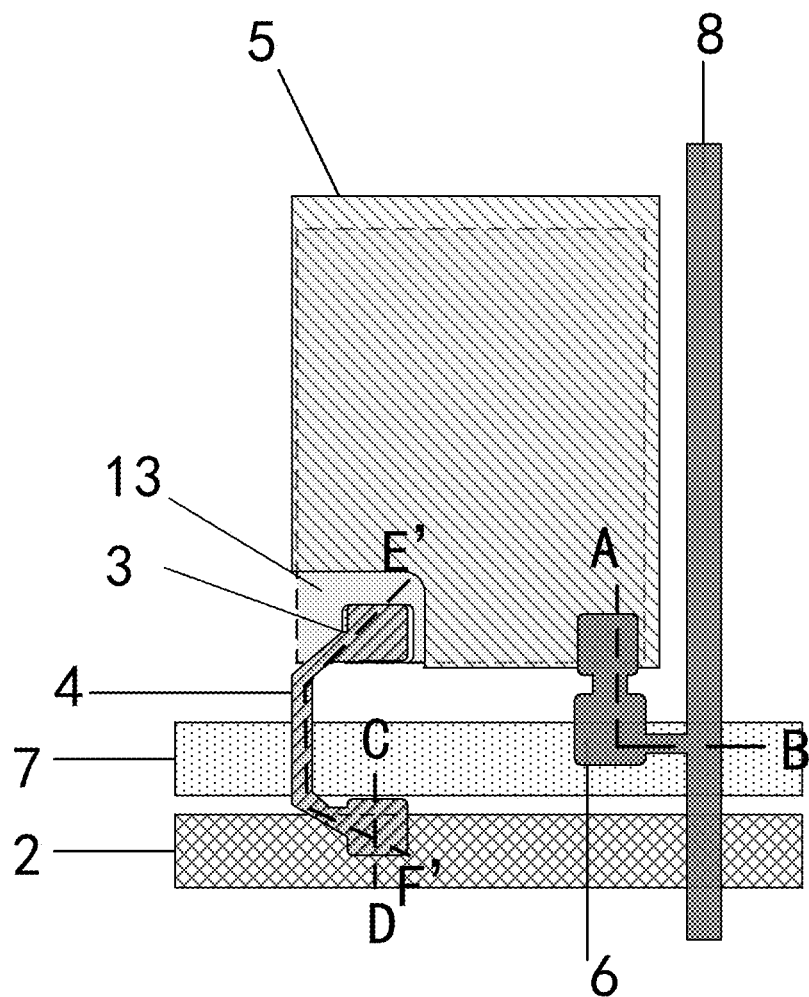
FIG. 3 is a schematic diagram of a structure of a portion of a pixel unit in a display substrate provided in the embodiments of the present disclosure.

As shown in FIGS. 1-3, this embodiment provides a display substrate including: a base 1, a plurality of common electrode lines 2, a plurality of common electrodes 3, a plurality of gate lines 7, a plurality of data lines 8, and a plurality of pixel units 9. FIG. 1 is a top view of the display substrate provided in this embodiment, FIG. 2 is a top view of the common electrodes and the common electrode lines in the display substrate with the pixel units removed, and FIG. 3 is a schematic diagram of a portion of the pixel unit 9 in FIG. 1.

Specifically, with reference to FIGS. 1 and 3, the base 1 includes a plurality of pixel units 9 distributed thereon in an array, each of which includes a pixel electrode 5 and a thin-film transistor 6. The plurality of gate lines 7 extend along a row direction, the plurality of data lines 8 extend along a column direction, and the plurality of gate lines 7 cross over the plurality of data lines 8 to define the plurality of pixel units 9. Each of the gate lines 7 is connected to a corresponding row of pixel units 9, and each of the data lines 8 is connected to a corresponding column of pixel units 9. Specifically, in a row of pixel units 9 connected to a gate line 7, a thin-film transistor 6 of each pixel unit 9 is connected to a pixel electrode 5. As a switching device of the pixel unit 9, the thin-film transistor 6 is turned on or off under the control of the gate line 7. If a thin-film transistor 6 in a pixel unit 9 is turned on, a voltage signal over a data line 8 connected to the pixel unit 9 can be transmitted to a pixel electrode 5 in the pixel unit 9, whereas if the thin-film transistor 6 is turned off, the voltage signal over the data line 8 can be blocked from being transmitted to the pixel electrode 5.

Specifically, with reference to FIGS. 2 and 3, the plurality of common electrodes 3 are distributed on the base 1 in an array, each of the plurality of common electrodes 3 corresponds to a respective one of the pixel electrodes 5 in the plurality of pixel units 9, and the common electrode 3 is disposed on a side of the pixel unit 5 proximal to the base 1. The plurality of common electrode lines 2 extend along the row direction, each of the common electrode lines 2 is connected to a corresponding row of common electrodes 3, and the common electrode line 2 inputs a common voltage (Vcom) to the corresponding row of common electrodes 3. Specifically, the common electrode line 2 may be connected to the common electrode 3 through a conductive connection portion 4 including conductive structures stacked on top of one another in a plurality of layers.

Since in the display substrate provided in this embodiment, the conducive connection portion 4, which bridges the common electrode 3 and the common electrode line 2, includes the conductive structures stacked on the top of one another in the plurality of layers, the resistance of the conductive connection portion 4 can be reduced, and therefore the resistance between the common electrode 3 and the common electrode line 2 can be reduced. Therefore, when the common electrode line 2 transmits a common voltage signal to the common electrode 3 through the conductive connection portion 4, the loss of the common voltage signal is eliminated, thereby reducing the voltage difference between the common electrodes 3 in the display substrate and improving the uniformity of the common voltage therein.

Figure 4A:
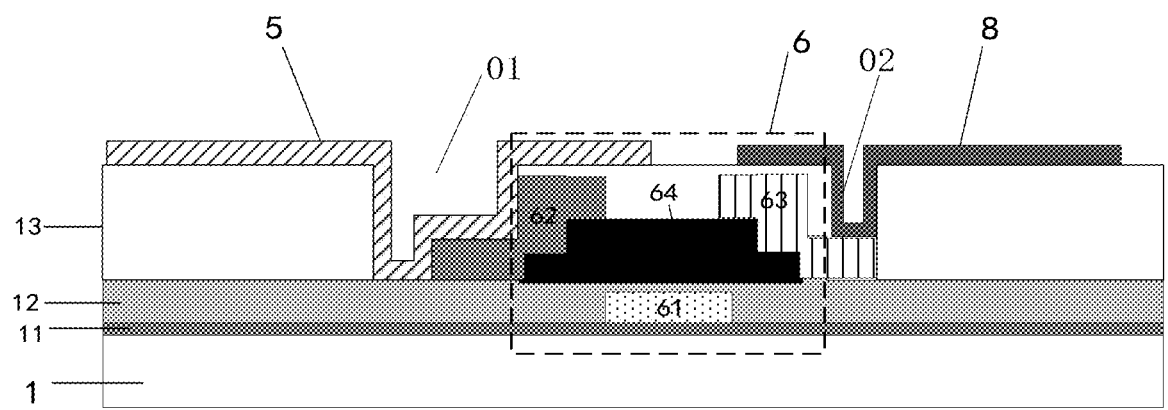
FIG. 4a is a cross-sectional view of a display substrate provided in some embodiments of the present disclosure along an A-B line in FIG. 3.
Figure 4B:
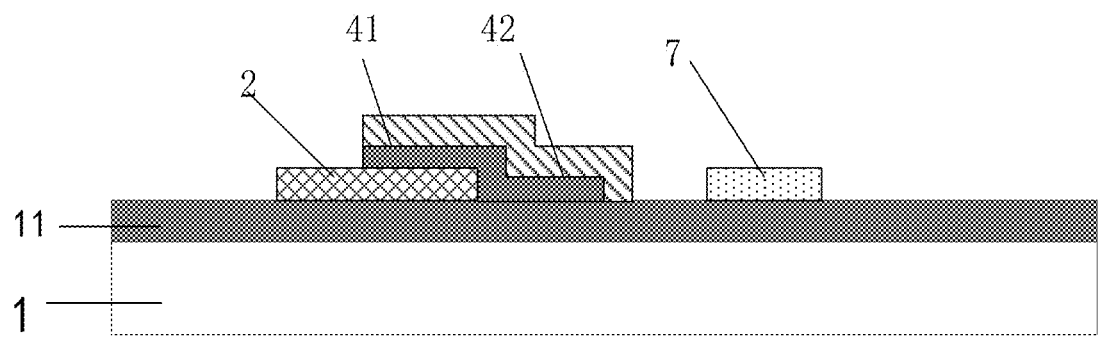
FIG. 4b is a cross-sectional view of a display substrate provided in some embodiments of the present disclosure along a C-D line in FIG. 3.
Figure 5:
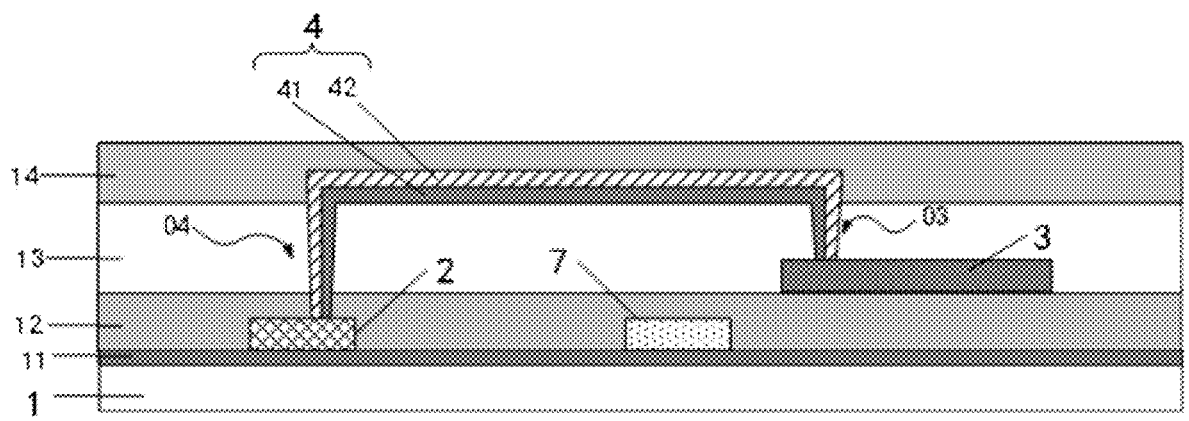
FIG. 5 is a cross-sectional view of a display substrate provided in some embodiments of the present disclosure along a E'-F' line in FIG. 3.

Further description will be made to the display substrate provided in this embodiment shown in FIGS. 3, 4a, 4b and 5. FIG. 4a is a cross-sectional view of the pixel unit taken along the A-B line in FIG. 3, FIG. 4b is a cross-sectional view of the pixel unit taken along the C-D line in FIG. 3, and FIG. 5 is a cross-sectional view of the pixel unit taken along the E'-F' line in FIG. 3. With reference to FIGS. 4A and 4b, in the display substrate provided in this embodiment, a buffer layer 11 is disposed on a side of the base 1 proximal to the pixel electrode 5, and the thin-film transistor 6 is disposed on a side of the buffer layer 11 proximal to the pixel electrode 5. The thin-film transistor 6 may include a plurality of film layers, for example, a gate electrode 61 disposed on a side of the buffer layer 11 distal to the base 1; an active layer 64 on top of the gate electrode 61; a gate insulation layer 12 between the active layer 64 and the gate electrode 61; a drain electrode 62 and a source electrode 63 disposed on a side of the active layer 64 distal to the gate insulation layer 12, and both being disposed on the same layer; and an interlayer insulation layer 13 between the drain electrode 62 and the source electrode 63. The active layer 64 is made of a semiconductor material, for example, amorphous silicon, polysilicon, organic semiconductor materials or the like, which is not limited herein.

Further, with reference to FIGS. 4a, 4b and 5, in the display substrate provided in this embodiment, the pixel electrode 5 is connected to the drain electrode 62 of the thin-film transistor 6 through a first via 01 disposed in the interlayer insulation layer 13; the data line 8 is connected to the source electrode 63 of the thin-film transistor 6 through a second via 02 disposed in the interlayer insulation layer 13; the gate line 7 is connected to the gate electrode 61 of the thin-film transistor 6; and in this embodiment, the gate electrode 61 and the gate line 7 are disposed in a same layer. The gate line 7 crosses over the data line 8, and the interlayer insulation layer 13 is disposed between the gate line 7 and the data line 8 so as to provide isolation between signals over the gate line 7 and the data line 8 and prevent crosstalk between the signals. A passivation layer may be further disposed on a side of the pixel electrode 5 distal to the base 1 so as to protect various devices in the display substrate.

It should be noted that, in the display substrate provided in this embodiment, as long as the data line 8 is connected to the source electrode 63 in the thin-film transistor 6 and the gate line 7 is connected to the gate electrode 61 in the thin-film transistor 6, the data line 8 and the gate line 7 may be disposed between any two film layers in the display substrate, which is not limited herein.

Further, with reference to FIGS. 4a and 5, in the display substrate provided in this embodiment, the conductive connection portion 4 may include conductive structures in a plurality of layers, for example, the conductive connection portion 4 may include conductive structures in two layers, that is, a first conductive structure 41 and a second conductive structure 42, wherein the first conductive structure 41 may be disposed in a same layer as the source electrode 63 and the drain electrode 62 in the thin-film transistor 6, and the first conductive structure 41 may be made of a same material as the source electrode 63 and the drain electrode 62; in other words, the first conductive structure 41 may be formed together with the source electrode 63 and the drain electrode 62 in the same step by a patterning process, and thus, it is possible to avoid the increased difficulty in the procedure of fabricating the display substrate. And also, the second conductive structure 42 may be disposed on the layer where the pixel electrode 5 is disposed, and may be made of the same material as that of the pixel electrode 5; in other words, the second conductive structure 42 may be fabricated together with the pixel electrode 5 in the same step by a patterning process, and thus, it is possible to further avoid the increased difficulty in the procedure of fabricating the display substrate. The conductive connection portion 4 is formed by stacking the second conductive structure 42, which is arranged on the same layer as the pixel electrode 5, on the first conductive structure 41, which is arranged on the same layer as the drain electrode 62 and the source electrode 63. The resistivity of the conductive connection portion 4 can be reduced by selecting the materials of the first conductive structure 41 and the second conductive structure 42, thereby reducing the resistance between the common electrode 3 and the common electrode line 2. Thus, when the common electrode line 2 inputs the common voltage signal to the common electrode 3 through the conductive connection portion 4, the loss of the common voltage signal is eliminated, thereby reducing the voltage difference between the common electrodes 3 in the display substrate and improving the uniformity of the common voltage therein.

In addition, as shown in FIG. 4a, during the formation of the drain electrode 62 and the pixel electrode 5 that is on top of and in contact with the drain electrode 62, a through-hole 01 that substantially conforms with the drain electrode 62 may be formed in the interlayer insulation layer 13 with at least a portion of the gate insulation layer 12 exposed, which will produce a stepped through-hole, so that the pixel electrode 5 is formed to have at least two planes with different heights in the through-hole 01, and thus, a via with different depths can be formed therein. Similarly, as shown in FIG. 4b, during the formation of the double-layered conductive connection portion 4, with reference to FIG. 3, the first conductive structure 41 may be formed on the edges of the common electrode line 2, that is, one portion of the first conductive structure is formed on the buffer layer 11, and the other portion thereof is formed on the common electrode line 2. Thus, a stepped through-hole will be formed between the common electrode line 2 and the gate line 7, so that the second conductive structure 42 that conforms with the first conductive structure 41 may be formed, and thus, a via with different depths may be formed between the gate line 7 and the common electrode line 2. These vias with different depths will facilitate flow of polyimide liquid (PI liquid) during the formation of an alignment layer (PI layer), as described below. This is because a via with different depths can make the PI liquid have different surface tensions in a deep-hole portion and a shallow-hole portion of the via and create a pressure difference inside the PI liquid around the via. When the PI liquid flows through the via, it will flow into the deep-hole portion thereof. Thus, it is possible to prevent the PI liquid from accumulating around the via and increase the fluidity of the PI layer, thereby ensuring the uniformity of the PI layer.

In other words, in the display substrate of the present disclosure, a metal layer of the source electrode/the drain electrode and a transparent conductive layer of the pixel electrode are formed, and at the same time, the conductive connection portion including the first conductive structure and the second conductive structure is formed. At a position of a step, a structure crossing the step can be formed so that the top surface of the formed structure also constitutes a stepped structure and the via thus formed has different depths. Therefore, the fluidity of the PI liquid can be increased during the formation of the alignment layer at a later stage, thereby ensuring the uniformity of the PI layer. Optionally, the source electrode 63 and the drain electrode 62 in the thin-film transistor may include various types of materials, for example, any one of silver (Ag), copper (Cu) and aluminum (Al). Since the material of the first conductive structure 41 may be the same as that of the source electrode 63 and the drain electrode 62, it may be any one of silver (Ag), copper (Cu) and aluminum (Al). The material of the pixel electrode 5 may include various types of transparent semiconductor materials, for example, Indium Tin Oxide (ITO). Since the material of the second conductive structure 42 may be the same as that of the pixel electrode 5, it may be ITO. Of course, the first conductive structure 41 and the second conductive structure 41 may as well be made of other materials, which are not limited herein.

It should be noted that the conductive connection portion 4 may include any number of conductive structures, which are stacked on top of one another to form the conductive connection portion 4 so as to reduce the resistance thereof. The specific number of the conductive structures in the conductive connection portion 4 may be set as needed, and is not limited herein.

Further, with reference to FIG. 5, the common electrode line 2 and the gate line 7 may extend along the same direction, be disposed on the same layer, and be made of the same material. The common electrode line 2 may be formed together with the gate line 7 in a same step by a patterning process, and thus, it is possible to avoid the increased difficulty in the procedure of fabricating the display substrate.

It should be noted that in the display substrate provided in this embodiment, the structure of the thin-film transistor 6 may include various types, and the position of the thin-film transistor 6 relative to the pixel electrode 5, the data line 8 and the gate line 7 may be set as needed. The examples shown in the figures are only for illustrative purposes, but not to impose any limitation on the embodiments of the present disclosure.

Optionally, in the display substrate provided in this embodiment, the position of the common electrode 3 relative to the pixel electrode 5 may be set in various manners. In an example, the common electrode 3 may be disposed on a side of the pixel electrode 5 proximal to the base 1. In an example, the common electrode 3 may be disposed on the layer where the pixel electrode 5 is disposed. In an example, the common electrode 3 may be disposed opposite to the pixel electrode 5, that is, the common electrode 3 and the pixel electrode 5 may be disposed on a color film substrate and an array substrate, respectively, and the color film substrate and the array substrate are disposed opposite to each other. Specifically, the position of the common electrode 3 relative to the pixel electrode 5 may be set as needed, and is not limited herein. In various settings of the positions of the common electrode 3 and the pixel electrode 5, the common electrode line 2 and the common electrode 3 can be connected through the conductive connection portion 4. In this embodiment, description is made by using the example in which the common electrode 3 is disposed on a side of the pixel electrode 5 proximal to the base 1. The interlayer insulation layer 13 is between the common electrode 3 and the pixel electrode 5 to provide isolation between signals thereof and prevent crosstalk between the signals.

Figure 6:
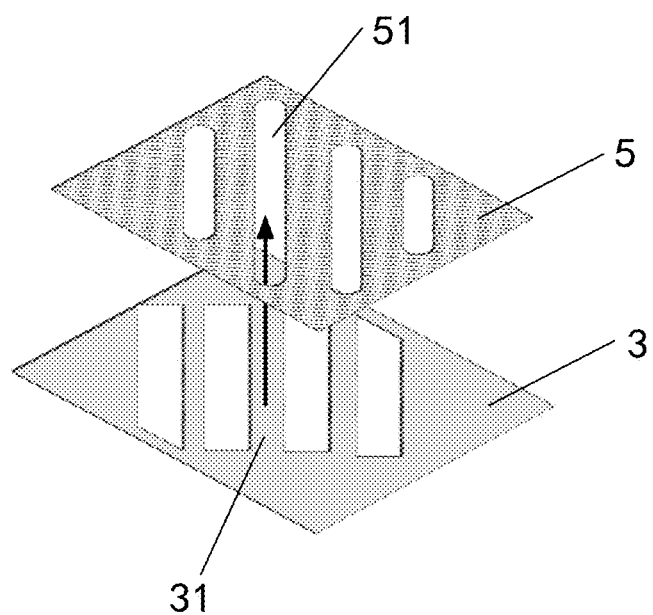
FIG. 6 is a schematic diagram of a structure of a pixel electrode and a common electrode in a display substrate provided in some embodiments of the present disclosure.

Further, as shown in FIG. 6, each of the plurality of common electrodes 3 corresponds to a respective one of the plurality of pixel electrodes 5, and the plurality of pixel electrodes 5 and the plurality of common electrodes 3 may include various types of electrodes, for example, block-shaped electrodes, strip-shaped electrodes, slit electrodes, comb-shaped electrodes, planar electrodes or the like. Taking the slit electrode as the pixel electrode 5 for example, the pixel electrode may have a plurality of slits 51, and correspondingly, the common electrode 3 may include a plurality of strip-shaped sub-electrodes 31 disposed at intervals. The strip-shaped sub-electrodes of the common electrode 3 are located on the base 1 and at positions opposite to the slits 51 of the pixel electrode 5, respectively. That is, an orthographic projection of the strip-shaped sub-electrode 31 of the common electrode 3 on the base 1 overlaps with an orthographic projection of the corresponding slit 51 of the pixel electrode 5 on the base 1, so that electric field lines generated by the common electrode 3 after a voltage is applied thereto may pass through the slit 51 of the pixel electrode 5 to maintain an electric field between the pixel electrode 5 and the common electrode 3. Of course, the common electrode 3 and the pixel electrode 5 may be other types of electrodes, which is not limited herein.

Further, with reference to FIGS. 3-5, in the display substrate provided in this embodiment, the common electrode 3 and the common electrode line 2 are located at different layers; for example, with reference to FIGS. 4a and 5, the common electrode 3 is located below the pixel electrode 5, and disposed in the interlayer insulation layer 13; the common electrode line 2 and the gate line 7 are disposed on the same layer, and the common electrode line 2 is disposed in the gate insulation layer 12; the interlayer insulation layer 13 and/or the gate insulation layer 12 are/is included between the common electrode 3 and the common electrode line 2; and the common electrode line 2 is disposed on a side of the common electrode 3 proximal to the base. One end of the conductive connection portion 4 is connected to the common electrode 3 through a third via 03 disposed in the interlayer insulation layer 13, and the other end of the conductive connection portion 4 is connected to the common electrode line 2 through a fourth via 04 disposed in the interlayer insulation layer 13 and the gate insulation layer 12, so that the common electrode 3 and the common electrode line 2 are connected to each other.

Figure 7:
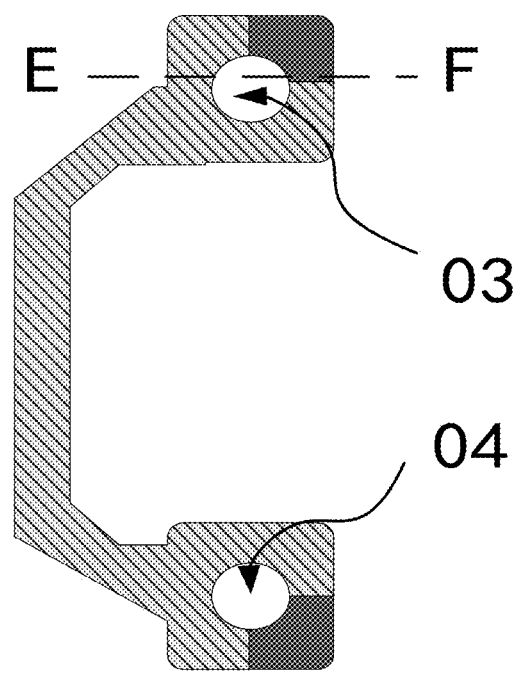
FIG. 7 is a schematic diagram of a structure of vias in a conductive connection portion in a display substrate provided in some embodiments of the present disclosure.
Figure 8:
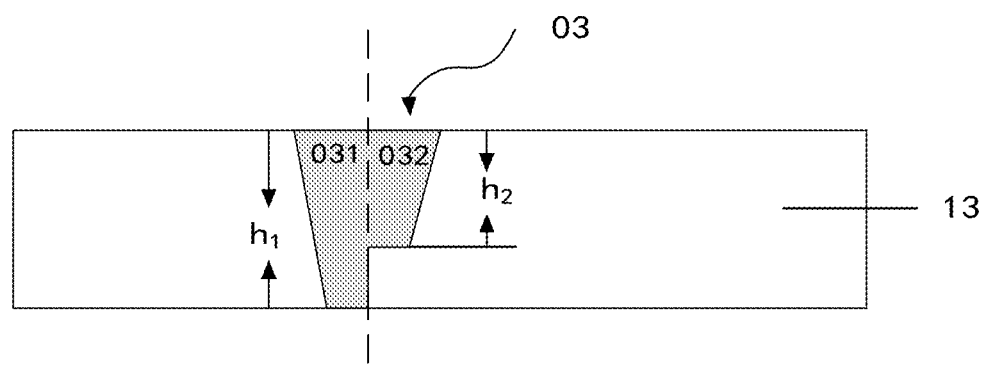
FIG. 8 is a cross-sectional view of a via in a conductive connection portion in a display substrate provided in some embodiments of the present disclosure along a E-F line in FIG. 7.
Figure 10:
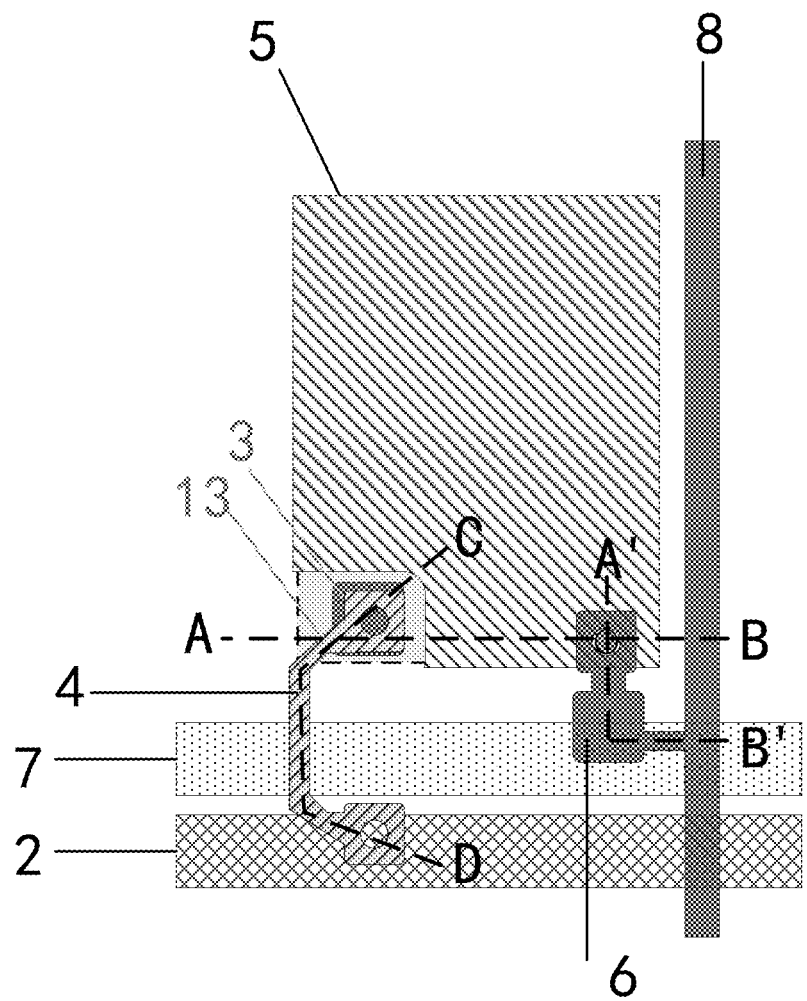
FIG. 10 is a schematic diagram of a structure of a portion of a pixel unit in a display substrate provided in some embodiments of the present disclosure.

Further, after the structure as shown in FIG. 3 is formed, vias can be opened in the respective portions of the conductive connection portion 4 disposed on the common electrode 3 and on the common electrode line 2. In addition, a via may alternatively be opened in the drain electrode of the thin-film transistor 6, as shown in FIG. 10. With reference to FIGS. 7 and 8, FIG. 8 is a cross-sectional view of the conductive connection portion 4 taken along the E-F line in FIG. 7. The third via 03 and the fourth via 04 are vias with different depths. Taking the third via 03 for example, the third via 03 may include a first portion 031 and a second portion 032, a depth $h_1$ of the first portion 031 may be greater than a depth $h_2$ of the second portion 032. Hereinafter, the first portion 031 is referred to as "a deep-hole portion", and the second portion 032 is referred to as "a shallow-hole portion". When the display substrate provided in this embodiment is applied to the display apparatus, there will be a liquid crystal layer above the display substrate. To control the orientation of liquid crystals, an alignment (PI) layer needs to be disposed on an outermost side of the display substrate distal to from the base 1. During the formation of the PI layer, the PI liquid needs to be coated on the display substrate to form the PI layer. During the coating process, the PI liquid may flow into the via in the display substrate. By making the via in the display subtract have different depths, the PI liquid can be caused to have different surface tensions in a deep-hole portion and a shallow-hole portion of the via, and a pressure difference can be created inside the PI liquid around the via. When the PI liquid flows through the via, it will flow into the deep-hole portion of the via, and thus, it is possible to prevent the PI liquid from accumulating around the via and increase the fluidity of the liquid PI, thereby ensuring the uniformity of the PI layer.

Optionally, in the above-mentioned display substrate provided in this embodiment, the fluidity of the PI liquid can be controlled by adjusting the proportion of the first portion to the second portion in the via. For example, as shown in FIG. 7, the first portion (that is, the deep-hole portion corresponding to the gray area around the via 03 in FIG. 7) accounts for one-quarter of the via, and the second portion (that is, the shallow-hole portion corresponding to the stripped area around the via 03 in FIG. 7) accounts for the remaining three-quarters thereof, that is, the area of the orthographic projection of the first portion of the via on the base 1 is equal to one-quarter of the area of the orthographic projection of the entire via thereon. If the PI liquid flows through the via, it will flow into the first portion that accounts for one-quarter of the via, thereby preventing the liquid PI from accumulating around the via.

Figure 9:
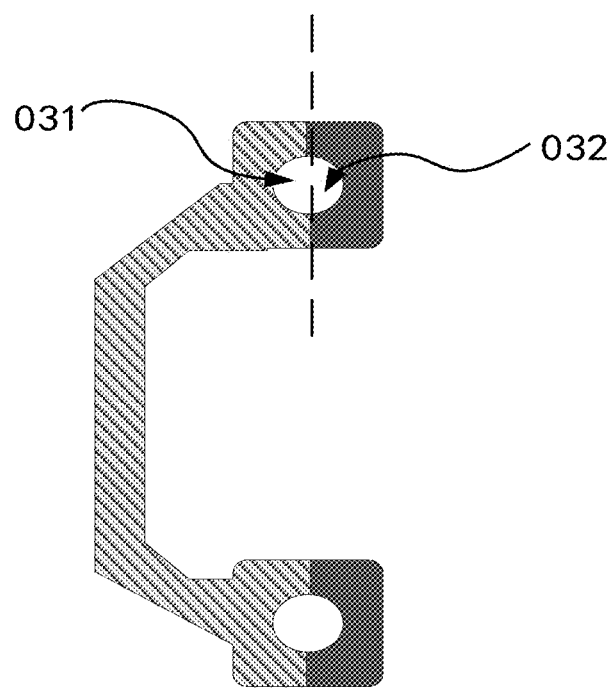
FIG. 9 is a schematic diagram of a structure of vias in a conductive connection portion in a display substrate provided in some embodiments of the present disclosure.

Optionally, as shown in FIG. 9, in the display substrate provided in this embodiment, the via may alternatively be a half-hole structure. In other words, the first portion 031 accounts for one half of the via, and the second portion 032 accounts for the other half thereof, that is, the respective areas of the orthographic projections of the first portion 031 and the second portion 032 of the via on the base 1 each account for one half of the area of the orthographic projection of the entire via thereon. If the PI liquid flows through the via, it will flow into the first portion 031 that accounts for one half of the via, thereby preventing the liquid PI from accumulating around the via.

As long as the formed structure can ensure that the common electrode and the corresponding common electrode line are electrically connected to each other through the conductive connection portion, the above-mentioned proportion will not be limited in the present disclosure.

It should be noted that in the display substrate provided in the embodiments of the present disclosure, the above-mentioned via with different depths can serve as any via between the film layers, for example, the first via 01, the second via 02, the third via 03 and the fourth via 04, thereby preventing the liquid PI from accumulating around the via in the display substrate and ensuring the uniformity of the PI layer.

Further, with reference to FIGS. 3 and 4a, the display substrate provided in the embodiments of the present disclosure includes a plurality of film layers (for example, the gate electrode 61, the gate insulation layer 12, the interlayer insulation layer 13, the drain electrode 62, the source electrode and the like), the common electrode 3 may be located between any two film layers in the display substrate, and the conductive connection portion 4 may make the common electrode 3 be connected to the common electrode line 2 through a via in the film layers between the common electrode 3 and the common electrode line 2. The via may be set to have the same structure as that of the above-mentioned via with different depths, which is not limited herein.

It should be noted that the display substrate provided in this embodiment may be fabricated by the processes using 5 or 6 masks, or may be alternatively fabricated by the processes using other possible number of masks. The examples shown in the figures are only for illustrative purposes, but not to impose any limitation on the embodiments of the present disclosure.

Figure 11:
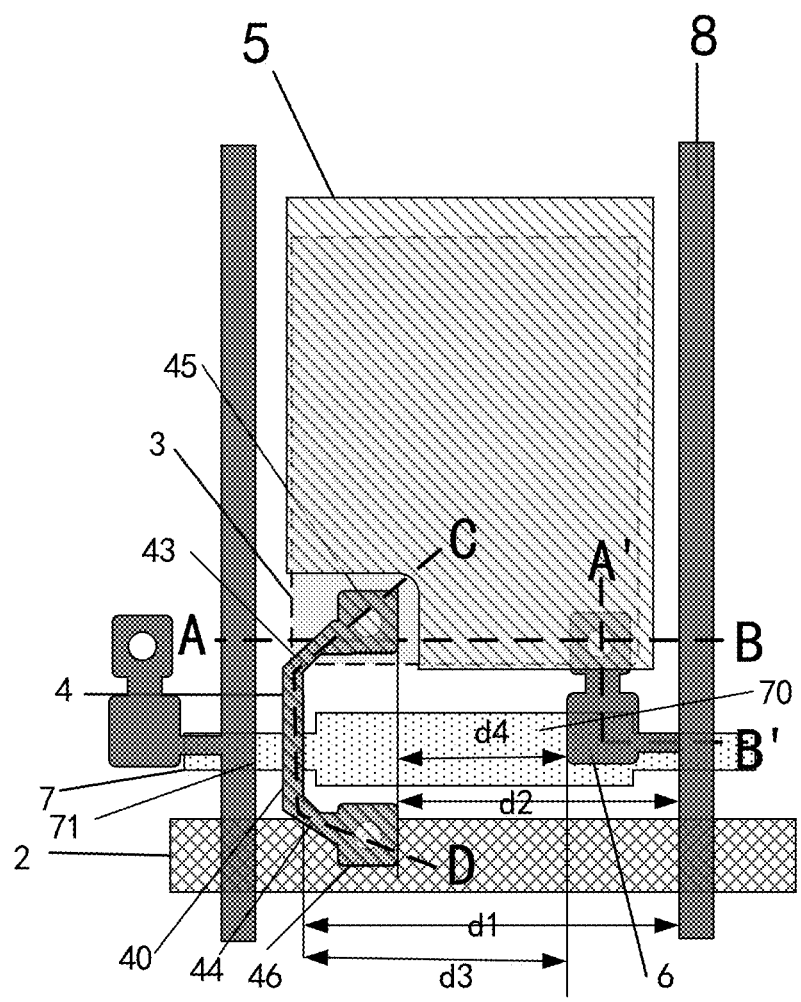
FIG. 11 is a schematic diagram of a structure of a portion of a sub-pixel in a display substrate provided in some embodiments of the present disclosure.

FIG. 11 is a schematic diagram of a structure of a portion of a sub-pixel in a display substrate provided in some embodiments of the present disclosure. FIG. 11 shows a structure of a sub-pixel unit defined by the gate lines 7 and the data lines 8, and a conductive connection portion 4 of the sub-pixel unit connects a common electrode 3 of the sub-pixel unit to a corresponding common electrode line 2 across the gate line 7. As shown in FIG. 11, the conductive connection portion 4 includes a first end 45, a second end 46, and a main body 40; the first end 45 is in direct contact with the common electrode 3, the second end 46 is in direct contact with the common electrode line 2, and an orthographic projection of the main body 40 on the base 1 is parallel to each of orthographic projections of two adjacent data lines 8 defining the sub-pixel unit (the sub-pixel unit is connected to one of the two adjacent data lines 8) on the base 1, and is located between the orthographic projections of the two adjacent data lines 8 on the base 1. The conductive connection portion 4 further includes a first intermediate portion 43 and a second intermediate portion 44; the first intermediate portion 43 is connected between the main body 40 and the first end 45, and the second intermediate portion 44 is connected between the main body 40 and the second end 46. With continued reference to FIG. 11, in an extending direction of the gate line 7, a first distance d1 between the orthographic projection of the main body 40 on the base 1 and an orthographic projection of the data line 8 connected to the sub-pixel unit on the base 1 is greater than a second distance d2 between an orthographic projection of the first end 45 or the second end 46 on the base 1 and the orthographic projection of the data line 8 connected to the pixel unit on the base 1. Accordingly, referring to FIG. 11, in the extending direction of the gate line 7, a third distance d3 between the orthographic projection of the main body 40 on the base 1 and an orthographic projection of a thin film transistor 6 of the sub-pixel unit on the base 1 is greater than a fourth distance d4 between the orthographic projection of the first end 45 or the second end 46 on the base 1 and the orthographic projection of the thin film transistor 6 of the sub-pixel unit on the base 1. That is, the conductive connection portion 4 connecting the common electrode 3 and the common electrode line 2 in the present disclosure deviates away from the thin film transistor of the sub-pixel unit across and above the gate line 7, so that the distance between the main body 40 and the thin film transistor 6 of the sub-pixel unit is increased, and the influence of the main body 40 on the thin film transistor 6 can be significantly reduced.

As shown in FIG. 11, the gate line 7 of the display substrate of the present disclosure may include a first gate line sub-portion 71 and a second gate line sub-portion 70 having different widths; the width of the second gate line sub-portion 70 is greater than that of the first gate line sub-portion 71. Further, as shown in FIG. 11, the first gate line sub-portion 71 having a smaller width of the gate line 7 overlaps with the corresponding data line 8 and the main body 40 of the conductive connection portion 4, so that a coupling capacitance between the gate line 7 and the data line 8 can be reduced, and a coupling capacitance between the gate line 7 and the main body 40 can also be reduced. In addition, as described above, the main body 40 of the conductive connection portion 4 across and above the gate line 7 in the display substrate of the present disclosure deviates away from the thin film transistor of the sub-pixel unit, so that a distance between the main body 40 and each of the thin film transistor 6 of the sub-pixel unit and the data line 8 connected to the sub-pixel unit is increased. Thus, the main body 40 and the data line 8 adjacent to the main body 40 can be closer to each other while the influence of the main body 40 on the thin film transistor 6 is significantly reduced, so that the main body 40 and the data line 8 adjacent to the main body 40 can share a same first gate line sub-portion 71 with a smaller width, and a resistance of the gate line can be reduced, which is beneficial to signal transmission.

Figure 12:
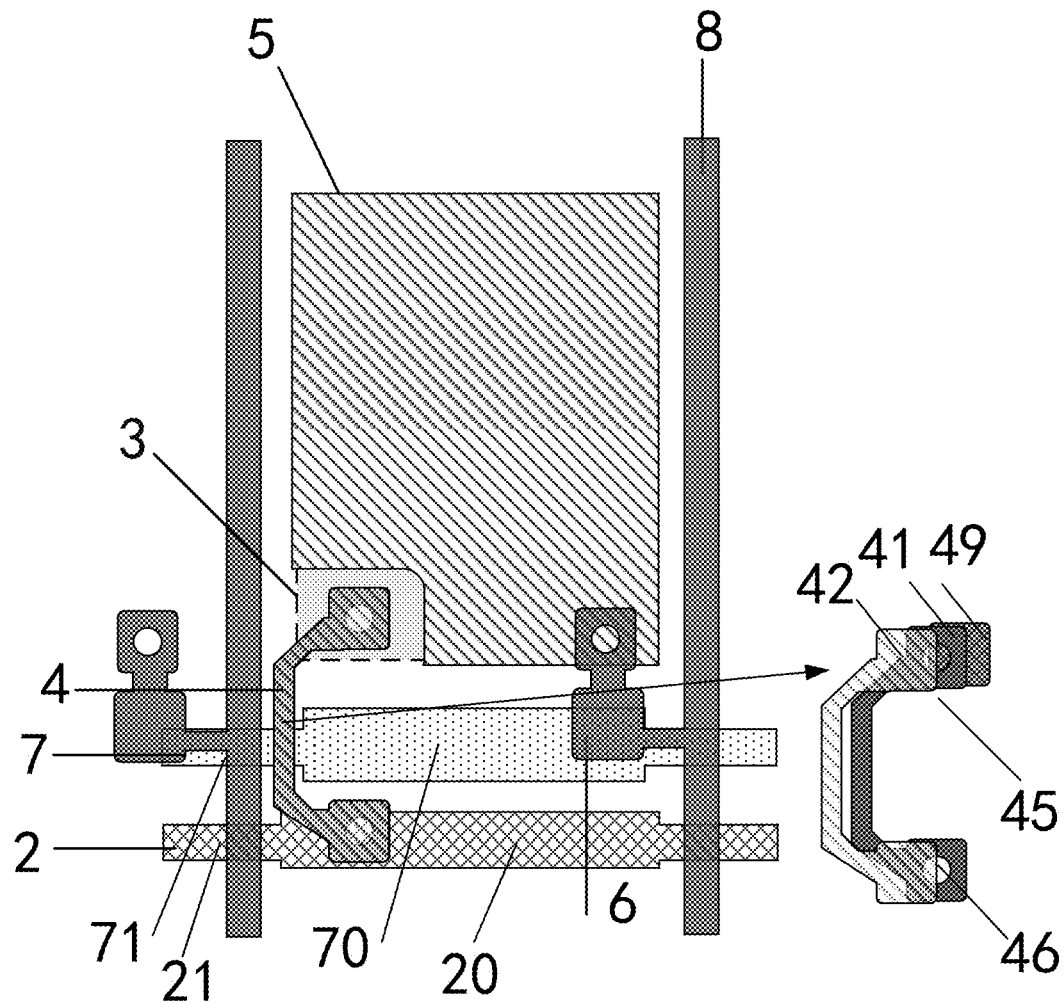
FIG. 12 is a schematic diagram of a structure of a portion of a sub-pixel in a display substrate provided in some embodiments of the present disclosure.

Further, in the array substrate of the present disclosure, like the gate line 7, the common electrode line 2 may also include a first common electrode line sub-portion 21 and a second common electrode line sub-portion 20 having different widths, and the width of the second common electrode line sub-portion 20 is greater than that of the first common electrode line sub-portion 21. As shown in FIG. 12, the first common electrode line sub-portion 21 having a smaller width of the common electrode line 2 overlaps with the data line 8, so that a coupling capacitance between the common electrode line 2 and the data line 8 can be reduced.

FIG. 12 also shows a specific layer structure of the conductive connection portion 4 on the right side. As shown, the first end 45 of the conductive connection portion 4 includes a pad 49 in direct electrical contact with the common electrode 3. The pad 49 may be, for example, rectangular. The conductive connection portion 4 further includes a first conductive structure 41 and a second conductive structure 42 above the first conductive structure 41. The pad 49 may be provided in the same layer as the gate line 7. As shown in FIG. 12, an orthographic projection of a portion of each of the first conductive structure 41 and the second conductive structure 42 at the first end 45 on the base 1 may overlap with an orthographic projection of the pad 49 on the base 1. That is, a contour of each of the first conductive structure 41 and the second conductive structure 42 at the first end 45 is consistent with that of the pad 49. For example, when the pad 49 is rectangular, the orthographic projection of the portion of the second conductive structures 42 at the first end 45 on the base 1 overlaps with an orthographic projection of the pad 49 on the base 1, so that the portion of the second conductive structures 42 at the first end 45 is also rectangular. At the first end 45, the second conductive structure 42 is electrically connected to the pad 49 through an opening in the first conductive structure 41. In addition, as described above, the first conductive structure 41 and the source electrode 62 and the drain electrode 62 may be formed through a patterning process in the same process, so that the process difficulty of forming the display substrate can be prevented from increasing. The second conductive structure 42 may be disposed in the same layer as the pixel electrode 5, and the second conductive structure 42 may be made of the same material as the pixel electrode 5. In the present embodiment, both the common electrode 3 and the pixel electrode 5 may be made of the ITO material.

In the conductive connection portion 4 of FIG. 12, only the first end 45 includes the pad 49 in direct contact with the common electrode 3. However, the present disclosure is not limited thereto. The second end 46 of the conductive connection portion 4 may also include the pad 49 between the first conductive structure 41 and the common electrode line 2, as shown in FIGS. 13A and 14A.

Figure 13A:
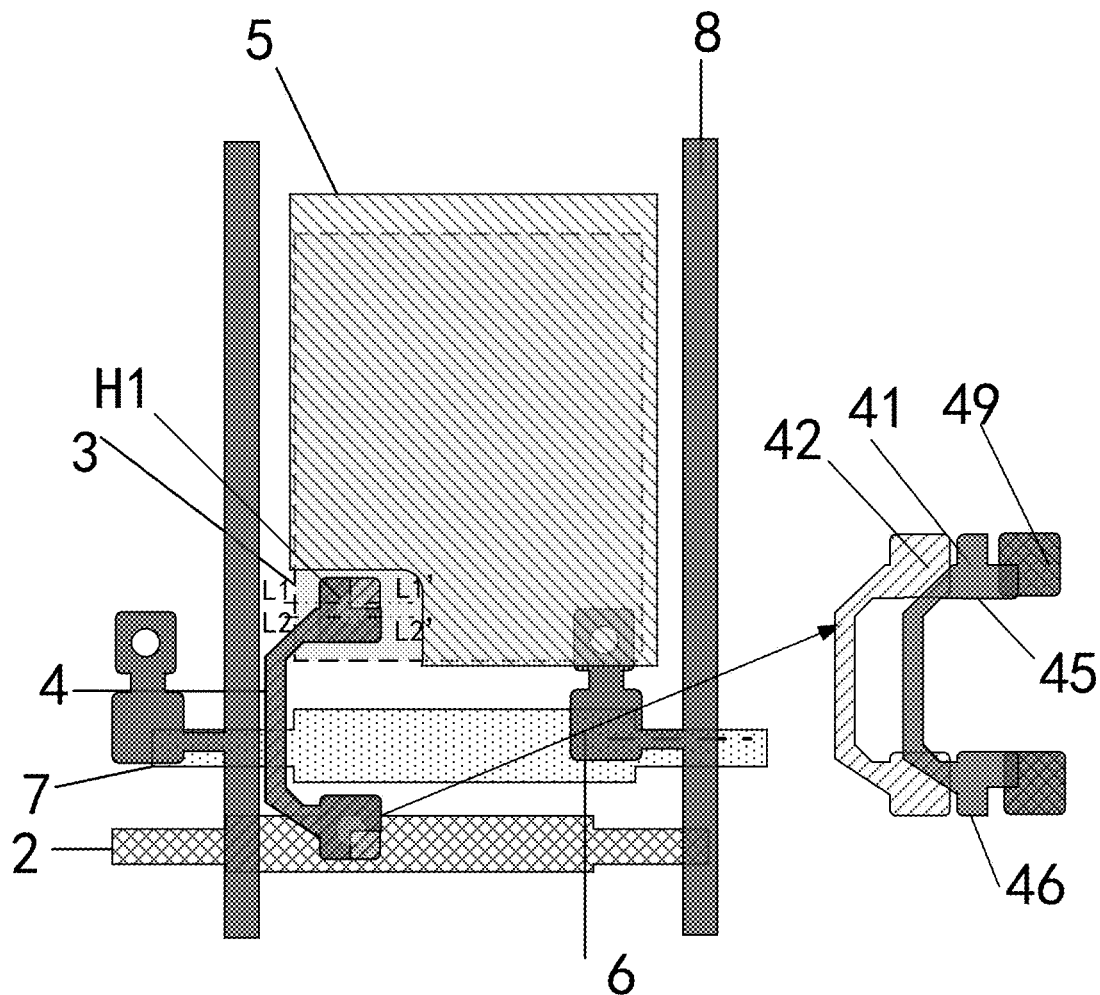
FIG. 13A is a schematic diagram of a structure of a portion of a sub-pixel in a display substrate provided in some embodiments of the present disclosure.
Figure 13B:
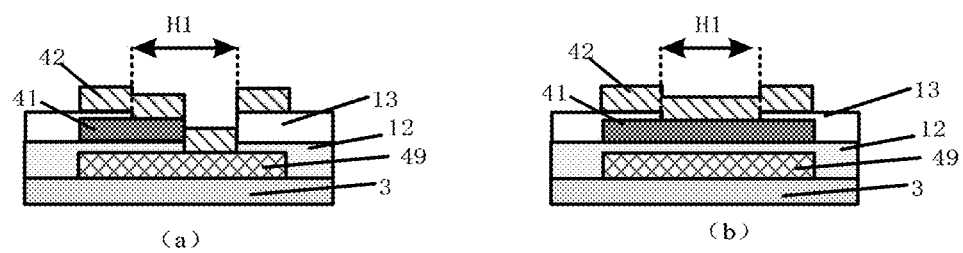
FIG. 13B is a schematic cross-sectional view of a first end of a conductive connection portion of a sub-pixel in FIG. 13A taken along lines L1-L1' and L2-L2' provided in some embodiments of the present disclosure.
Figure 14A:
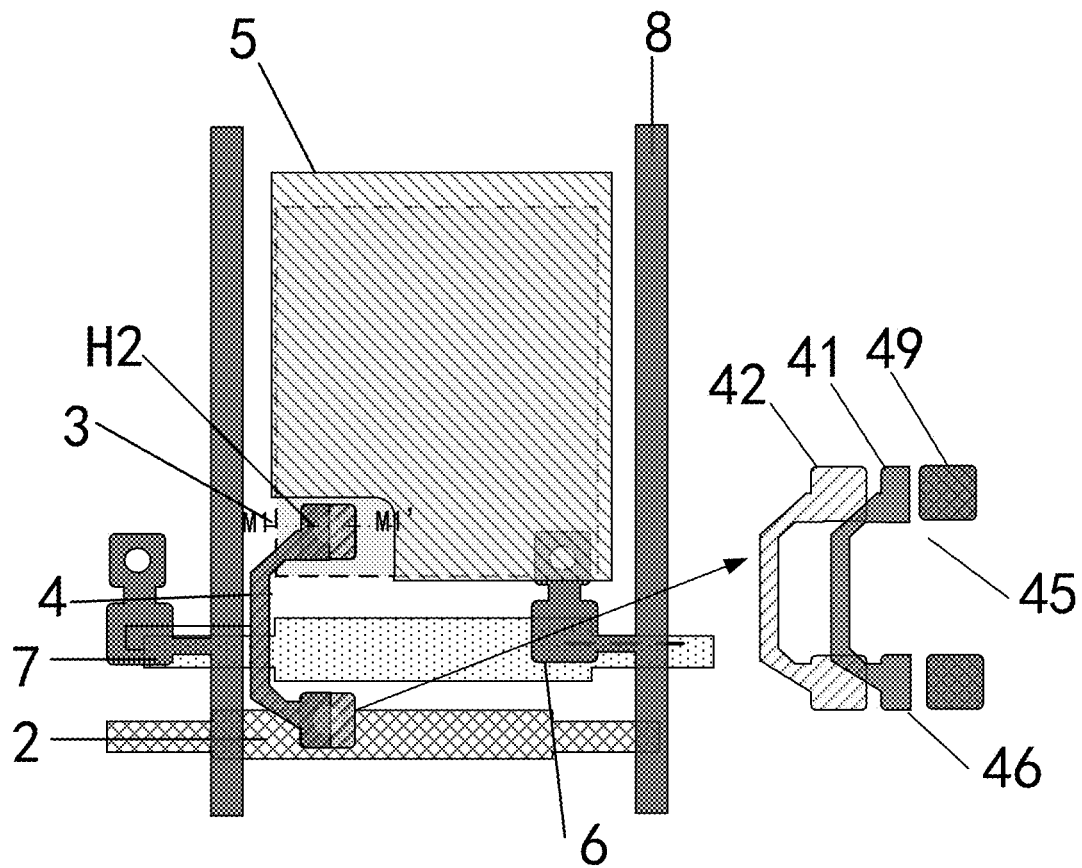
FIG. 14A is a schematic diagram of a structure of a portion of a sub-pixel in a display substrate provided in some embodiments of the present disclosure.
Figure 14B:
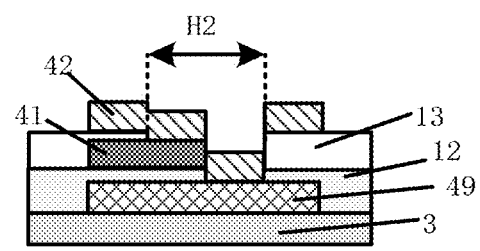
FIG. 14B is a schematic cross-sectional view of a first end of a conductive connection portion of a sub-pixel of FIG. 14A taken along a line M1-M1' provided in some embodiments of the present disclosure.

FIG. 13A and FIG. 14A each illustrate a schematic diagram of a structure of a portion of a pixel array in a display substrate provided in some embodiments of the present disclosure. As shown in FIGS. 13A and 14A, the first end 45 of the conductive connection portion 4 in the present embodiment includes the rectangular pad 49 and a portion of the first conductive structure 41 and a portion of the second conductive structure 42 formed on the pad 49 on a side close to a sub-pixel opening area of the sub-pixel unit (i.e., a light-transmitting area of the sub-pixel unit, or close to a center of the pixel electrode 5 of the sub-pixel unit where the conductive connection portion 4 is located). Unlike FIG. 12, in the embodiment of FIG. 13A, the first conductive structure 41 is not provided on about ¼ of an area of the rectangular pad 49 close to the sub-pixel opening area at the first end 45. That is, the first conductive structure 41 is absent on the about ¼ of the area of the rectangular pad 49 close to the sub-pixel opening area. Based on this, in (a) and (b) of FIG. 13B, ¾ of a via (opening) H1 penetrates onto the first conductive structure 41 and ¼ of the via penetrates onto the pad 49. In this case, a part, of ¼ of the area of the rectangular pad 49 close to the sub-pixel opening area, within in the via H1 is in direct contact with the second conductive structure 42, as shown in (a) and (b) of FIG. 13B; in order to further increase a contact area of the second conductive structure 42 with the pad 49, as shown in FIGS. 14A and 14B, the first conductive structure 41 is not provided on about ½ of an area of the pad 49 close to the pixel electrode 5 at the first end 45. Based on this, ½ of the via H2 penetrates onto the first conductive structure 42 and ½ of the via penetrates onto the pad 49. As described above, the portion of the first end 45 of the conductive connection structure 4 without the first conductive structure 45 is arranged on a side close to the pixel electrode 5, so that a height of a layer structure of a portion of the first end 45 close to the pixel electrode 5 is consistent with that of a layer structure inside the sub-pixel opening area of the sub-pixel unit.

Specifically, as shown in FIG. 13B, at the first end 45 of the conductive connection structure 4, the pad 49 being conductive is directly formed on the common electrode 3. For example, the conductive pad 49 is made of a metal material. The pad 49 may be disposed in the same layer as the gate line 7, for example. In this case, a first insulation layer on the pad 49 may be the gate insulation layer 12, for example. For example, the first conductive structure 41 may be disposed in the same layer as the source and drain electrodes of the thin film transistor and is formed on the gate insulation layer 12. As shown in FIG. 13B (a), for example, the first conductive structure 41 is not provided on about ¼ of an area of the rectangular pad 49 close to the sub-pixel opening area at the first end 45. The portion of the first conductive structure 41 at the first end 45 is provided only on about ¾ of the area of the pad 49. A second insulation layer, such as the interlayer insulation layer 13, is formed on the first conductive structure 41. Then, the opening H1 is formed at the first end 45. For example, the opening H1 may be formed proximately at a center of the first end 45. The opening H1 penetrates through the interlayer insulation layer 13 over about ¾ of the area of the pad 49 and penetrates through the interlayer insulation layer 13 and the gate insulation layer 12 over about ¼ of the area of the pad 49. Based on this, when the second conductive structure 42 is formed, ¼ of the area of the rectangular pad 49 close to the sub-pixel opening area is in direct contact with the second conductive structure 42.

Similarly, as shown in FIG. 14B, at the first end 45 of the conductive connection portion 4 in the embodiment shown in FIG. 14A, ½ of the area of the rectangular pad 49 close to the sub-pixel opening area is in direct contact with the second conductive structure 42 when the second conductive structure 42 is formed.

Further, the present disclosure also provides a display substrate, as shown in FIGS. 15 to 18.

The array substrate of the present disclosure includes the plurality of gate lines 7 and the plurality of data lines 8, which intersect with each other to define sub-pixel opening areas of a plurality of sub-pixel unit. Each sub-pixel unit includes a common electrode 3 and the pixel electrode 5 opposite to each other. As shown in FIGS. 15 to 18, the array substrate of the present disclosure further includes the plurality of common electrode lines 2 parallel to the plurality of gate lines 7. As shown in FIGS. 15 to 18, each sub-pixel unit in the present disclosure includes one conductive connection portion 4, which is connected to a corresponding common electrode line 2 across the gate line 7. Each sub-pixel unit in each row is connected to a corresponding common electrode line 2 through the conductive connection portion 4 of the sub-pixel opening area of each sub-pixel unit.

Figure 15:
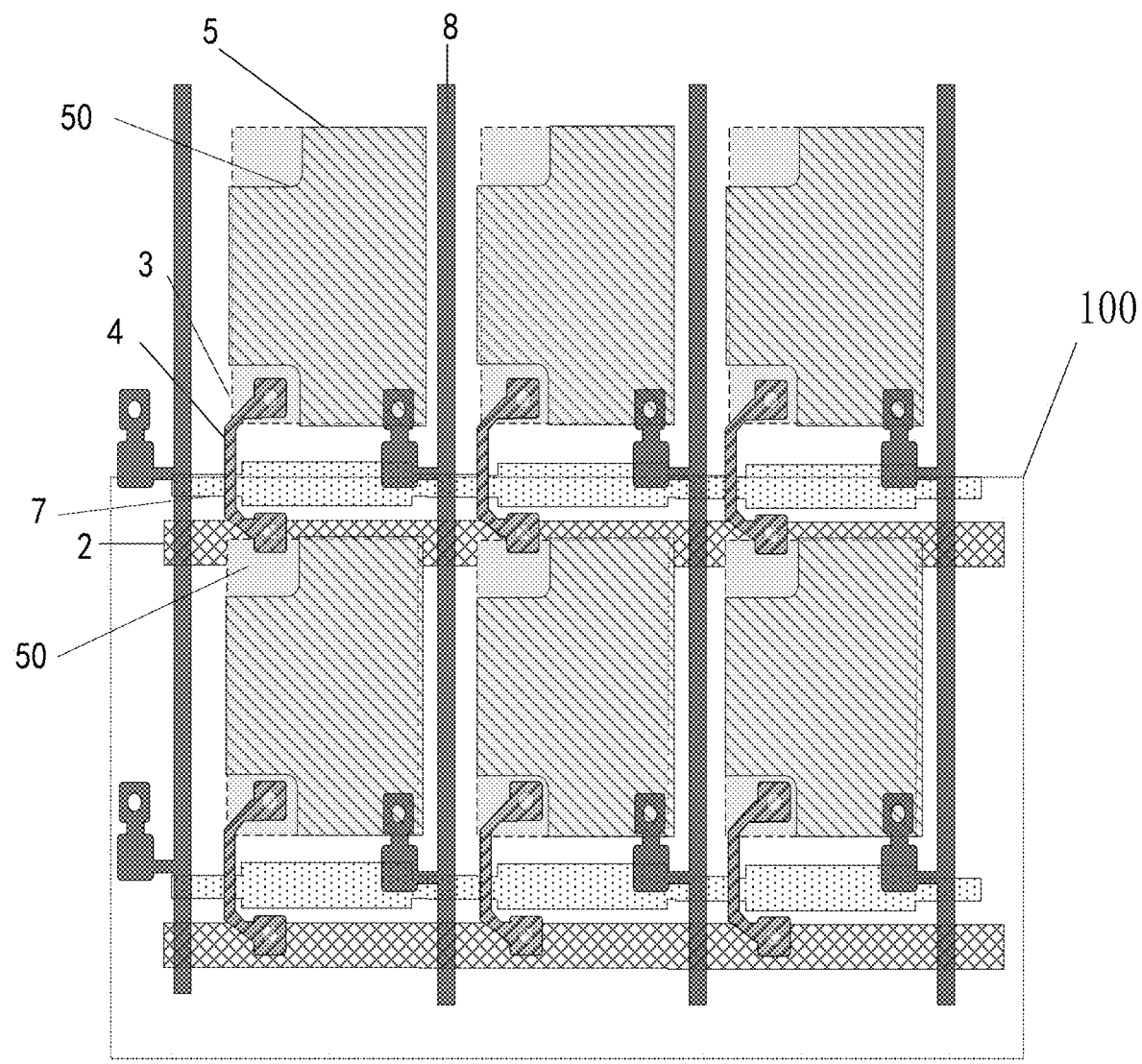
FIG. 15 is a schematic diagram of a structure of a portion of a pixel array in a display substrate provided in some embodiments of the present disclosure.

In the array substrate of FIG. 15, each gate line 7 includes the first gate line sub-portion 71 and the second gate line sub-portion 70 having different widths; the width of the second gate line sub-portion 70 is greater than that of the first gate line sub-portion 71. Unlike FIG. 15, each gate line 7 in the array substrate of FIG. 16 includes the first gate line sub-portion 71 and the second gate line sub-portion 70 having different widths, and each common electrode line 2 in the array substrate of FIG. 16 include the first common electrode line sub-portion 21 and the second common electrode line sub-portion 20 having different widths, and the width of the second common electrode line sub-portion 20 is greater than the width of the first common electrode line sub-portion 21, so that the overlapping area of the common electrode lines and the gate lines with the data lines and the conductive connection portions in the array substrate become smaller, thereby reducing a coupling capacitance of the entire array substrate.

Figure 16:
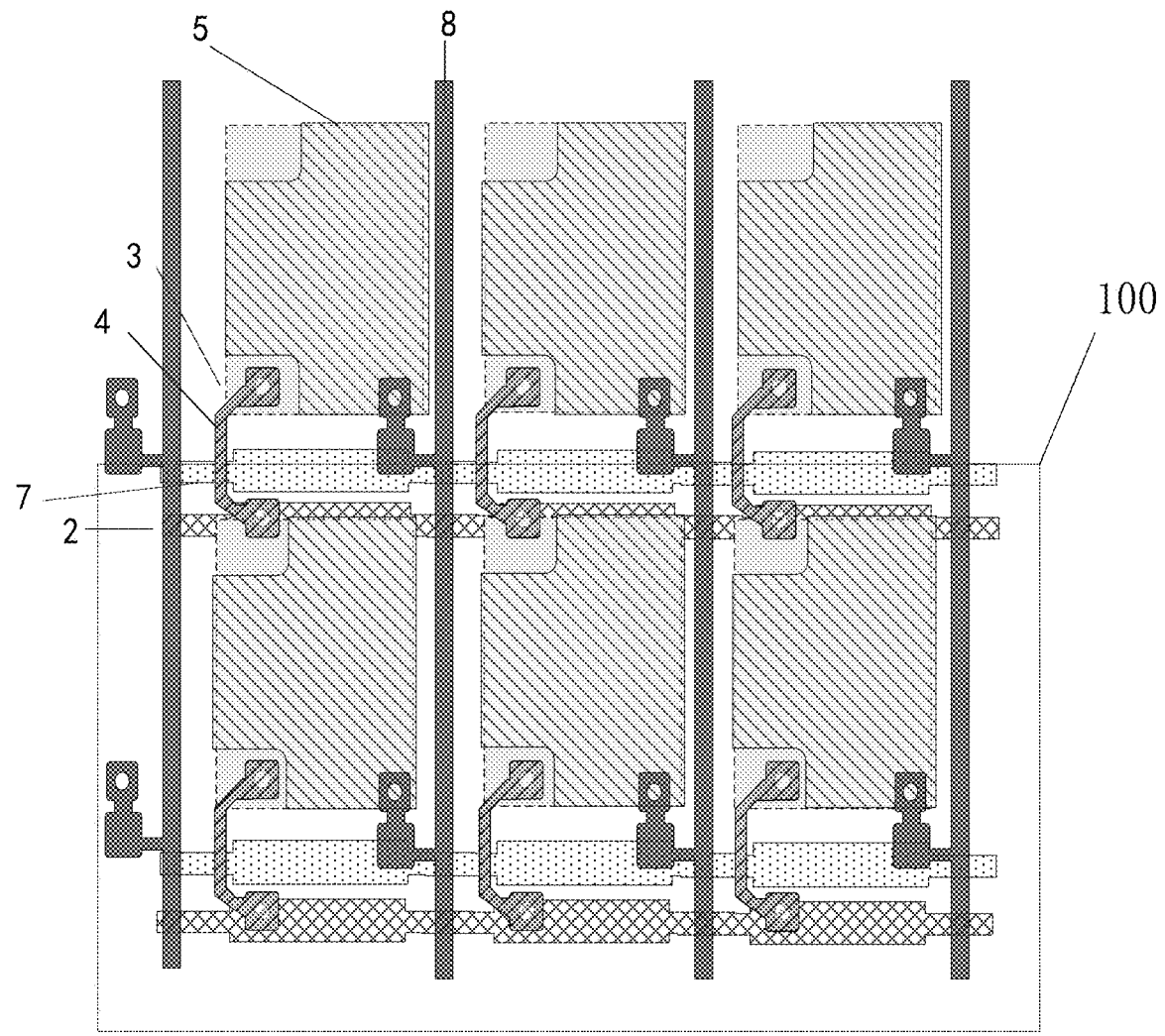
FIG. 16 is a schematic diagram of a structure of a portion of a pixel array in a display substrate provided in some embodiments of the present disclosure.

As shown in FIGS. 15 and 16, three adjacent sub-pixel units in each row of sub-pixel units may constitute one pixel unit 100. For example, each pixel unit 100 includes a first color sub-pixel unit, a second color sub-pixel unit, and a third color sub-pixel unit. In one embodiment, each pixel unit 100 may include a red sub-pixel unit, a green sub-pixel unit, and a blue sub-pixel unit.

In addition, as shown in FIGS. 15 and 16, the common electrodes 3 of each row of sub-pixel units may partially overlap with and be in direct contact with the common electrode line 2 for a previous row of sub-pixel units. As shown in FIG. 15, at the second end 46 of the conductive connection structure 4 where the common electrode 3 is in direct contact with a corresponding common electrode line 2, the pixel electrode 5 includes a notch 50 at a portion of the pixel electrode 5 overlapping with the conductive connection structure 4 to prevent the pixel electrode 5 from contacting with the second end 46 of the conductive connection structure 4. As shown in FIG. 15, the pixel electrode 5 and the corresponding common electrode line 2 partially overlap with each other in a direction perpendicular to the common electrode 3.

In the array substrate shown in FIGS. 15 and 16, the conductive connection portions 4 of each column of pixel units are located on the same side of the column of sub-pixel units. For example, the conductive connection portion 4 of each sub-pixel unit may be located at a lower left corner of the sub-pixel opening area of the sub-pixel unit. Such an arrangement has little influence on display of the entire array substrate.

Figure 17:
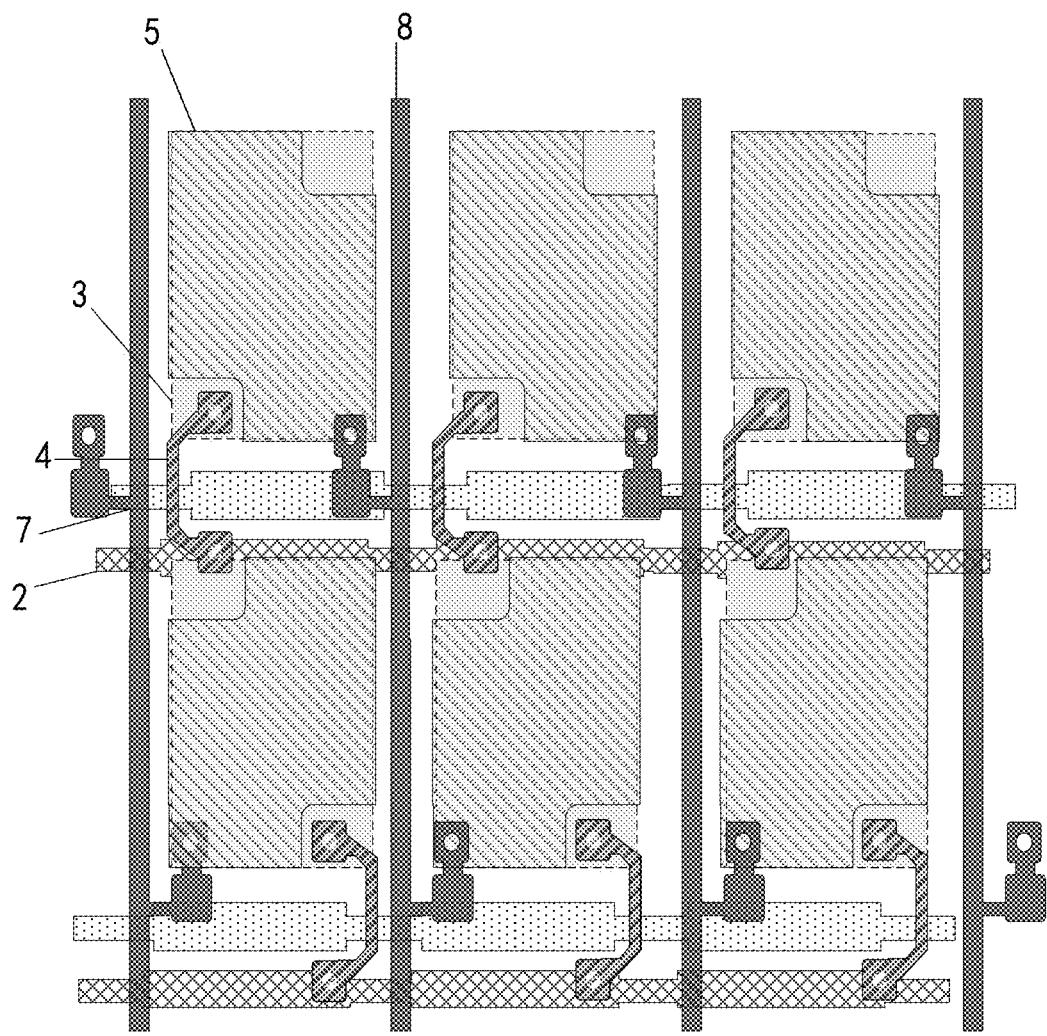
FIG. 17 is a schematic diagram of a structure of a portion of a pixel array in a display substrate provided in some embodiments of the present disclosure.

Unlike FIGS. 15 and 16, in the array substrate of FIG. 17, the conductive connection portions 4 in each column of pixel units are alternately arranged at the lower left corners and the lower right corners of the sub-pixel opening areas of the sub-pixel units, so that the thin film transistors 6 connected to the same data line are alternately arranged on the left and right sides of the data line.

Figure 18:
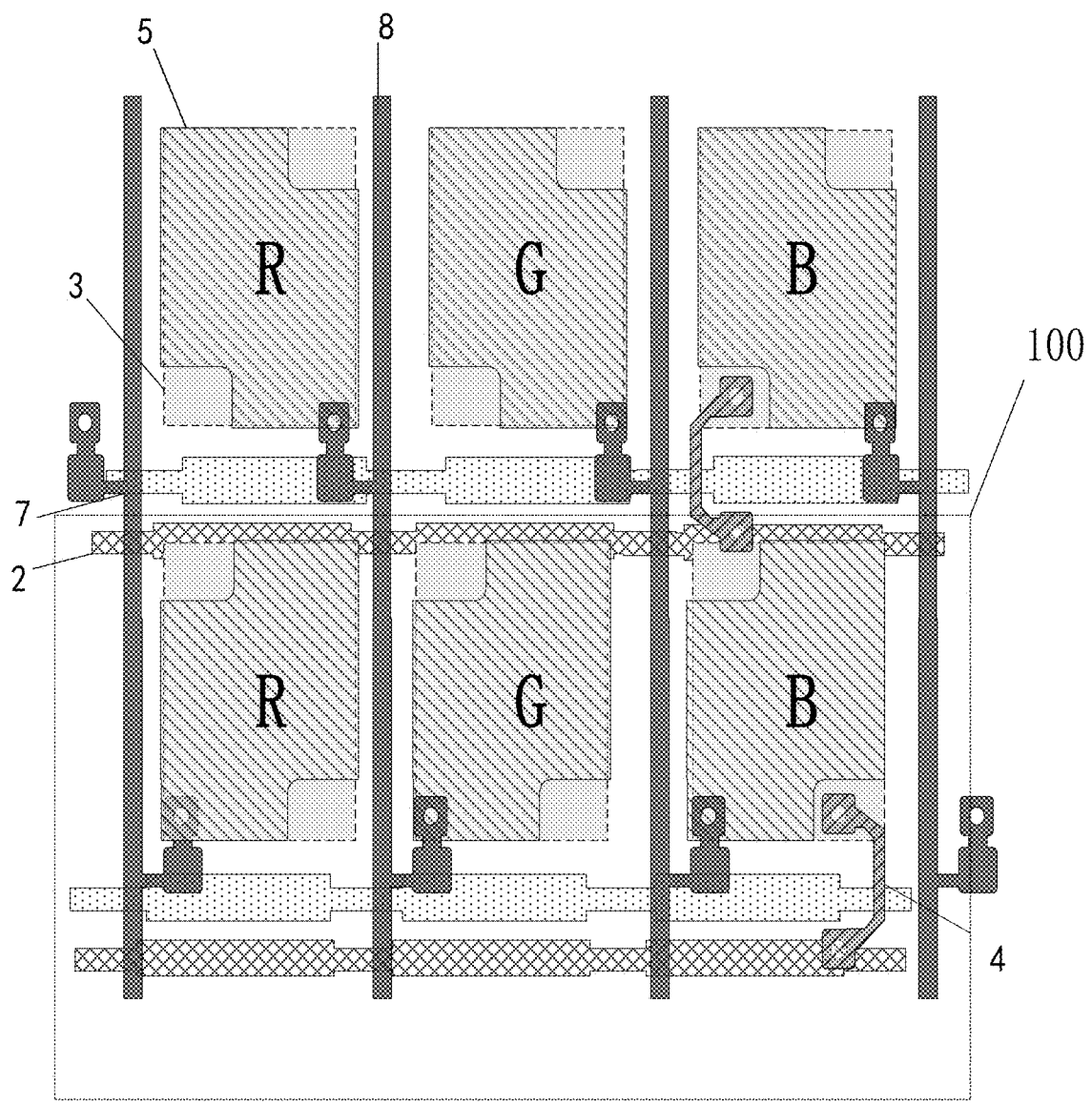
FIG. 18 is a schematic diagram of a structure of a portion of a pixel array in a display substrate provided in some embodiments of the present disclosure.

Further, as shown in FIG. 18, the conductive connection portions 4 may be arranged only in the column of sub-pixel units of one color in the same pixel column, for example, may be located only in the columns of blue sub-pixel units (the columns of blue sub-pixels B), and the conductive connection portions 4 may be not arranged in the column of sub-pixel units of other colors in the same pixel column, for example, may be not arranged in the columns of red sub-pixel units R and the columns of green sub-pixels G. With such an arrangement, the influence on the display is less. In addition, the conductive connection portions 4 in the same column of sub-pixel units are alternately arranged left and right. For example, as shown in FIG. 18, in the same column, the conductive connection portion 4 in the blue sub-pixel B in the first row of sub-pixel units is arranged at the lower left corner of the sub-pixel opening area where the conductive connection portion 4 is located, and the conductive connection portion 4 in the blue sub-pixel B in the second row of sub-pixel units is arranged at the lower right corner of the sub-pixel opening area where the conductive connection portion 4 is located. Accordingly, such an arrangement allows thin film transistors connected to the same data line 8 to be alternately located on the left and right sides of the data line, thereby facilitating the polarity inversion of the sub-pixels in the image frame.

Correspondingly, this embodiment further provides a display panel including the above-mentioned display substrate. The display panel may be of any shapes. In the present embodiment, description will be made by using the example in which the display panel is of a rectangular shape.

Optionally, the display panel provided in this embodiment may include a Gate Driver On Array (GOA) circuit connected to the plurality of gate lines and used for driving the plurality of gate lines, and an X-Printed Circuit Board (X-PCB) disposed on an outside of the display panel and connected to the plurality of data lines through a Flexible Printed Circuit (FPC), and the X-PCB is used for driving the plurality of data lines and providing voltage signals to the plurality of data lines. Of course, in the display panel, a Gate Driver Integrated Circuit (G-IC) may alternatively be used for driving the plurality of data lines, which is not limited herein.

Correspondingly, this embodiment further provides a display apparatus including the above-mentioned display panel. The display apparatus may be any product or component having a display function, such as a mobile phone, a tablet computer, a television, a monitor, a notebook computer, a digital photo frame, a navigator or the like. It should be understood by a person skilled in the art that the display apparatus should have other necessary elements, which will not be repeated herein, and should not be construed as a limitation to the present disclosure.

It should be understood that, the above embodiments are merely exemplary embodiments for the purpose of illustrating the principle of the present disclosure, and the invention is not limited thereto. It will be apparent to a person skilled in the art that various changes and modifications can be made therein without departing from the spirit and scope of the present disclosure, and these are to be considered as the scope of the present disclosure.

What is claimed is:

1. A display substrate, comprising:
   a base;
   a plurality of gate lines extending in a row direction;
   a plurality of data lines extending in a column direction, wherein the plurality of data lines and the plurality of gate lines are on the base and cross over each other to define a plurality of sub-pixel units;
   a plurality of common electrodes distributed on the base in an array; wherein each sub-pixel unit is provided with a common electrode therein;
   a plurality of common electrode lines extending along the row direction, wherein the plurality of common electrode lines are connected to the plurality of common electrodes, respectively; and
   a plurality of conductive connection portions, wherein one of the plurality of common electrode lines is correspondingly connected to at least one of the plurality of common electrodes through a corresponding conductive connection portion, and each conductive connection portion comprises a plurality of conductive structures stacked on top of one another in a plurality of layers; wherein
   each conductive connection portion comprises a first end in direct contact with a corresponding common electrode and a second end in direct contact with a corresponding common electrode line, and a main body connected between the first end and the second end;
   an orthographic projection of the main body on the base is parallel to an orthographic projection of the plurality of data lines on the base; and
   a first distance between the main body and a data line connected to a sub-pixel unit corresponding to the main body is greater than a second distance between the data line and at least one of the first end or the second end.

2. The display substrate according to claim 1, wherein each of the plurality of sub-pixel units comprises: a thin film transistor; and
   a third distance between the main body and a thin film transistor of a sub-pixel unit corresponding to the main body is greater than a fourth distance between the thin film transistor and at least one of the first end or the second end.

3. The display substrate according to claim 2, wherein the first end is connected to the common electrode;
   the conductive structures in the plurality of layers of the conductive connection portion comprise a first conductive structure and a second conductive structure; and
   the first end comprises a pad in direct contact with the common electrode, a portion of the first conductive structure over the pad, and a portion of the second conductive structure over the portion of the first conductive structure.

4. The display substrate according to claim 3, wherein the pad is a rectangular pad.

5. The display substrate according to claim 4, wherein the sub-pixel unit comprises an opening area, and at least a portion of the rectangular pad close to the opening area is in direct contact with the second conductive structure.

6. The display substrate according to claim 5, further comprising:
   a first insulation layer on the rectangular pad wherein the portion of the first conductive structure is arranged on a portion of the first insulation layer corresponding to ¾ or ½ of an area of the rectangular pad at a side away from the opening area;
   a second insulation layer on the first conductive structure, wherein the first insulation layer is in direct contact with the second insulation layer on ¼ or ½ of an area of the rectangular pad at a side close to the opening area, and the portion of the first conductive structure is in direct contact with the second insulation layer on ¾ or ½ of an area of the rectangular pad at a side away from the opening area; and a via extending through the first insulation layer and the second insulation layer, wherein an orthographic projection of a center of the via on the base overlaps with an orthographic projection of a center of the rectangular pad on the base; and wherein the portion of the second conductive structure is arranged on a portion of the second insulation layer corresponding to the rectangular pad, and the portion of the second conductive structure is in direct contact with the rectangular pad on ¼ or ½ of an area of the via at a side of the via close to the opening area.

7. The display substrate according to claim 5, wherein the sub-pixel unit further comprises a pixel electrode;

the pad and the gate line are arranged a the same layer, and are made of a same material; and the portion of the first conductive structure is disposed in a same layer as a source electrode and a drain electrode of the thin film transistor, and is made of a same material as the drain electrode and/or the source electrode, and the portion of the second conductive structure is disposed in a same layer as the pixel electrode, and is made of a same material as the pixel electrode.

8. The display substrate according to claim 4, wherein the portion of the first conductive structure is not arranged on approximately ¼ or ½ of an area of the pad.

9. The display substrate according to claim 8, wherein an orthographic projection of the portion of the second conductive structure on the base is within an orthographic projection of the pad on the base; and an orthographic projection of the portion of the first conductive structure on the base overlaps with the orthographic projection of the pad on the base.

10. The display substrate according to claim 1, wherein the gate line comprises a plurality of first gate line sub-portions and a plurality of second gate line sub-portions alternately arranged in an extending direction of the gate line;

in a direction perpendicular to the extending direction of the gate line, a width of each first gate line sub-portion is less than that of the second gate line sub-portion; and an orthographic projection of each data line on the base partially overlaps with an orthographic projection of the first gate line sub-portion of the gate line, which crosses over the data line, on the base.

11. The display substrate according to claim 10, wherein an orthographic projection of the conductive connection portion on the base partially overlaps with an orthographic projection of the first gate line sub-portion of a corresponding gate line on the base.

12. The display substrate according to claim 1, wherein the common electrode line comprises a plurality of first common electrode line sub-portions and a plurality of second common electrode line sub-portions alternately arranged in an extending direction of the common electrode line;

in a direction perpendicular to the extending direction of the common electrode line, a width of the first common electrode line sub-portion is less than that of the second common electrode line sub-portion; and an orthographic projection of each data line on the base partially overlaps with an orthographic projection of the first common electrode line sub-portion of a corresponding common electrode line on the base.

13. The display substrate according to claim 1, wherein each of the plurality of sub-pixel units comprises the conductive connection portion; and the conductive connection portions in each column of sub-pixel units are all arranged on a same side of the column of sub-pixel units.

14. The display substrate according to claim 1, wherein each of the plurality of sub-pixel units comprises the conductive connection portion; and the conductive connection portions in each column of sub-pixel units are alternately arranged on opposite sides of the column of sub-pixel units.

15. The display substrate according to claim 1, wherein the plurality of sub-pixel units comprise a plurality of columns of first color sub-pixel units, a plurality of columns of second color sub-pixel units and a plurality of columns of third color sub-pixel units, which are sequentially arranged along the row direction in a sequence of one column of first color sub-pixel units, one column of second color sub-pixel units and one column of the third color sub-pixel units;

the third color sub-pixel unit in each column of third color sub-pixel units comprises the conductive connection portion; and the conductive connection portions in the column of third color sub-pixel units are alternately arranged on opposite sides of the column of third color sub-pixel units.

16. The display substrate according to claim 15, wherein the third color sub-pixel unit comprises a blue sub-pixel unit.

17. The display substrate according to claim 1, wherein, an interlayer insulation layer is arranged between the plurality of gate lines and the plurality of data lines;

the interlayer insulation layer extends between the pixel electrode and the corresponding common electrode;

the conductive connection portion further comprises a first connection portion that is disposed in a via in the interlayer insulation layer disposed on the common electrode and is in contact with the common electrode, and a second connection portion that is disposed in a via in the interlayer insulation layer disposed on the common electrode line and is in contact with the common electrode line; and at least one of the first connection portion and the second connection portion comprises a hole, which comprises a first portion and a second portion, a depth of the first portion being greater than that of the second portion.

18. The display substrate according to claim 17, wherein an area of an orthographic projection of the first portion on the base is one quarter or a half of an area of an orthographic projection of the hole on the base.

19. A display panel, comprising the display substrate according to claim 1.

20. A display apparatus, comprising the display panel according to claim 19.

* * * * *